(12) United States Patent
Ohashi

(10) Patent No.: US 6,657,482 B2
(45) Date of Patent: Dec. 2, 2003

(54) DIGITAL FILTER

(75) Inventor: Toru Ohashi, Kawagoe (JP)

(73) Assignee: Pioneer Corporation, Tokyo-To (JP)

( * ) Notice: Subject to any disclaimer, the term of this patent is extended or adjusted under 35 U.S.C. 154(b) by 0 days.

(21) Appl. No.: 10/144,864

(22) Filed: May 15, 2002

(65) Prior Publication Data

US 2002/0186073 A1 Dec. 12, 2002

(30) Foreign Application Priority Data

Jun. 6, 2001 (JP) ...................................... P2001-171375

(51) Int. Cl.$^7$ ................................................ H03B 1/00
(52) U.S. Cl. ...................................... 327/552; 327/553
(58) Field of Search ................................ 327/552, 553, 327/551, 554, 557, 558, 559, 99, 334, 344, 345, 379; 708/300, 306, 316

(56) References Cited

U.S. PATENT DOCUMENTS

| | | | | |
|---|---|---|---|---|
| 3,997,770 A | * | 12/1976 | Claasen et al. | 708/306 |
| 4,852,034 A | * | 7/1989 | Takayama | 708/301 |
| 5,303,173 A | * | 4/1994 | Mori et al. | 708/322 |
| 5,367,476 A | * | 11/1994 | Elliott | 708/301 |
| 5,546,431 A | * | 8/1996 | Bazes | 375/350 |
| 5,717,726 A | * | 2/1998 | Herrmann et al. | 375/350 |
| 5,886,913 A | * | 3/1999 | Marguinaud et al. | 364/714.011 |
| 6,009,445 A | * | 12/1999 | Tsyranovich | 708/300 |
| 6,118,331 A | * | 9/2000 | Yunus et al. | 327/553 |
| 6,141,672 A | * | 10/2000 | Driendl et al. | 708/320 |
| 6,311,203 B1 | * | 10/2001 | Wada et al. | 708/625 |
| 6,356,142 B1 | * | 3/2002 | Mittel | 327/553 |
| 6,446,103 B2 | * | 9/2002 | Schollhorn | 708/319 |

* cited by examiner

Primary Examiner—Timothy P. Callahan
Assistant Examiner—Hai L. Nguyen
(74) Attorney, Agent, or Firm—Morgan, Lewis & Bockius LLP

(57) ABSTRACT

A digital filter for forming a feedback path including a delay unit, applying a filter operation to an input signal, giving a frequency characteristic having a predetermined time constant, and generating an output signal, is provided with: a selector having a multiplier for implementing time constants in at least two stages, and selecting the connection of the multiplier corresponding to a preset time constant to perform time constant switching; a timing generator for determining the timing when the time constant switching is performed by the selector; and a correction device for correcting the output of the delay unit to suppress variations in the output signal in the determined timing.

10 Claims, 7 Drawing Sheets

DIGITAL FILTER

BACKGROUND OF THE INVENTION

1. Field of the Invention

The technical field of the present invention relates to that of a digital filter in which an input signal is filtered using a feedback path configured with delay device, generating an output signal with a frequency characteristic having a predetermined time constant.

2. Description of the Related Art

Recent tuner designs capable of receiving and demodulating AM or FM broadcasts have increasingly incorporated various digital signal processing. In a digitized tuner, a digital filter is used to remove undesired frequency components from the input signal. To perform the level detection of the input signal for example, a low-pass filter for removing modulation components can be formed from a digital filter. Furthermore, by appropriate adjustment of an AGC amplifier gain for IF signals based on the level detection output by the digital filter, a stable detection output can be maintained regardless of variations in the receiving field strength of the tuner.

However, the receiving field strength of a tuner may rapidly change with time. As an example, the receiving field strength of an automotive tuner rapidly increases or decreases when it enters or exits a place such as a tunnel where reception of radio waves is difficult. If the time constant of the low-pass filter used for the level detection of the AGC amplifier is too large, it is possible that the slowed response time cannot follow such rapid changes in the receiving field strength. This can lead to insufficient control of the AGC amplifier gain, resulting in a deterioration of the detection output. Conversely, if the time constant of the low-pass filter is small, although the response time is reduced, undesired modulation components cannot be removed. Thus, the low-pass filter for use with the level detection of the AGC amplifier in a tuner is preferably configured so that the time constant can be switched between a large value and a small value. Therefore, if the receiving field strength varies rapidly, the time constant can temporarily be set to a small value so that the output of the low-pass filter can be followed, thereby ensuring satisfactory operation of the AGC amplifier.

Changing the time constant of the low-pass filter (as described above) in an analog tuner can easily be configured by switching the connection paths corresponding to the two time constants determined by circuit constants. Similarly, if a digital filter is used, the time constant is determined by the coefficient of a multiplier, and thus a comparable configuration may be achieved in which the time constant can be switched by changing the connection of the two paths for which different coefficients are established.

However, as an example, an IIR type digital filter comprises a feedback path including a delay unit. One problem with such a filter is ensuring successful matching with the delay unit at the timing when switching the time constant. That is, in the IIR type digital filter, if the coefficient of the multiplier changes when the time constant is switched, the data in the delay unit needs to change for matching therewith. However, old data is held in the delay unit just after the switching and thus mismatching occurs. Consequently, the output of the digital filter temporarily becomes discontinuous at the time of switching. This results in the further problem of noise caused in the detection output when switching the time constant if the digital filter is applied to the level detection of the AGC amplifier.

SUMMARY OF THE INVENTION

Accordingly, the present invention has been accomplished in view of such problems, and aims to provide a digital filter which includes a configuration for switching the time constant, and which can ensure a stable operation without producing noise at the instant of switching the time constant.

The above object of the present invention can be achieved by a digital filter for forming a feedback path including a delay device, applying a filter operation to an input signal, giving a frequency characteristic having a predetermined time constant, and generating an output signal, provided with: a time constant switching device having operation device for implementing time constants in at least two stages, and selecting the connection of said operation device corresponding to a preset time constant to perform time constant switching; a timing determination device for determining the timing for correcting the output of said delay device according to the switching direction of time constant when said time constant switching is performed; and a correction device for correcting the output of said delay device to suppress variations in said output signal in said determined timing.

In accordance with this invention, the time constant for a digital filter can be switched in two or more steps, and if a time constant is set, the connection of operation device is selected, and the digital filter operates with a desired time constant. Accordingly, depending on the state of variation in the input signal, the time constant of the digital filter can be optimized to secure a balance between stability and follow-up ability. Furthermore, when the time constant is changed, the timing for correcting the output of the delay device included in the feedback path is determined, and according to the switching direction of the time constant, the output of the delay device is appropriately corrected with the determined timing. As a result, by correcting the data mismatching in the delay device at the time of switching the time constant, noise due to the digital operation can be prevented.

As described above, in accordance with the present invention, a configuration for switching the time constant is provided in a digital filter, and the delay device in the feedback path is corrected so as to suppress the variation in the output signal at the time of switching the time constant, so a stable operation can be secured without producing noise due to the filter operation.

In one aspect of the digital filter of the present invention, said time constant switching device has a first selecting device inserted inside said feedback path, and a second selecting device inserted outside said feedback path, said first selecting device and said second selecting device provided with: two or more multipliers for which coefficients corresponding to different time constants are respectively set; and a selector for selectively connecting said multiplier matching said preset time constant.

In accordance with this invention, in addition to the action of the invention as set forth in claim 1, there is provided a configuration in which the first selecting device and the second selecting device are respectively inserted inside and outside the feedback path of the digital filter, and two or more multipliers and selectors are provided in each selecting device to enable the connection corresponding to the established time constant.

Thus, it is only needed to select the connection of the two selectors to change the time constant, and moreover, a desired time constant in the digital filter can be selected without performing complicated processing.

In another aspect of the digital filter of the present invention, said timing determination device generates a timing control signal according to said switching direction of time constant in said determined timing.

In accordance with this invention, in addition to the action of the invention as set forth in claim 1, the correction of the output of the delay device is defined according to the time constant signal, so the data mismatching in the delay device can automatically be corrected without the need for a complex determination.

In further aspect of the digital filter of the present invention, said timing control signal generates a pulse for one clock from said determined timing based on the clock supplied to said delay device.

In accordance with this invention and in addition to the action of the invention as set forth in claim 3, the timing for correcting the output of the delay device has a pulse width for one clock based on the clock of the delay unit, so the correction can be made at the minimum time interval necessary to decrease the effect on the normal operation of the digital filter.

In further aspect of the digital filter of the present invention, said correction device contains two or more multipliers in which coefficients corresponding to different time constants are respectively set; and a selector for selectively connecting the output of said multipliers or the output of said delay device based on said timing control signal in said determined timing.

In accordance with this invention and in addition to the actions of the invention as set forth in claim 3 or 4, there is provided a configuration in which the first selecting device and the second selecting device are respectively inserted inside and outside the feedback path of the digital filter, and two or more multipliers and selectors are provided in each selecting device to enable the selection of the connection corresponding to the preset time constant. Thus, it is only needed to select the connection of the two selectors to change the time constant, and a desired time constant in the digital filter can be selected without performing complicated processing.

In further aspect of the digital filter of the present invention, said input signal is the receiving signal of a tuner; and said output signal is used for detecting the level corresponding to said receiving signal.

In accordance with this invention, there is provided a configuration in which the digital filter constructed as described above is applied to a tuner, the received signal of a tuner is inputted to the digital filter, and the level detection is performed with the output signal, so the optimum time constant can be set for a variation in the received signal to detect the level of the received signal of the tuner stably and promptly.

In further aspect of the digital filter of the present invention, said time constants can be switched in two stages; and a large time constant is normally set as said time constant, while a small time constant is set as said time constant when the receiving field strength varies rapidly.

In accordance with this invention and in addition to the action of the invention as set forth in claim 6, there is provided a configuration in which the time constant is set to a large value under normal conditions where the receiving field strength in the tuner is stable, and when the receiving field strength fluctuates rapidly from that stable condition, the time constant is switched to a small value, so the generation of noise due to the operation of the digital filter can be eliminated to improve the receiving performance of the tuner even if the tuner enters or exists in a place which makes it difficult for radio waves to reach the tuner.

DETAILED DESCRIPTION OF THE PREFERRED EMBODIMENTS

Now, the preferred embodiments of the present invention are described according to the drawings. In the embodiments, the description assumes the case where the present invention is applied to a digital filter used for performing level detection of the received signal of a tuner, or the like.

Figure 1:
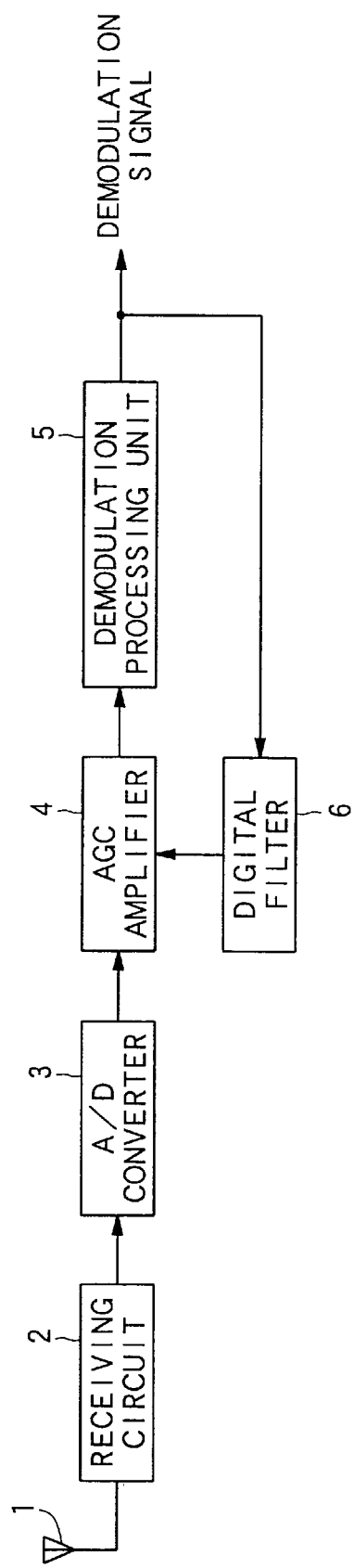
FIG. 1 is a block diagram showing the configuration of the main portions in the case where the digital filter related to the present invention is applied to a tuner for receiving AM.

FIG. 1 is a block diagram showing the configuration of the main portions in the case where the digital filter related to the present invention is applied to a tuner for receiving AM. In FIG. 1, an antenna 1, a receiving circuit 2, an A-D converter 3, an AGC amplifier 4, a demodulation processing unit 5, and a digital filter 6 are shown.

In the above configuration, when the transmitted radio waves from a broadcast station are received by the antenna 1, the corresponding receiving signal is inputted to the receiving circuit 2. In the receiving circuit 2, through various tuning and amplifier circuits, the frequency corresponding to a desired station is extracted by PLL, and the frequency is decreased by a mixing process to generate an IF (intermediate frequency) signal. The IF signal outputted from the receiving circuit 2 is converted to a digital signal by the A-D converter 3, and thereafter inputted to the AGC amplifier 4 and amplified with a gain which is set to maintain a predetermined output level. Since the level of the IF signal also decreases as the receiving field strength to the tuner decreases, the AGC amplifier 4 is used to compensate the reduction of the level.

The output from the AGC amplifier is supplied to the demodulation processing unit 5, and a demodulation signal corresponding to the AM modulation is extracted. The demodulation signal is finally outputted to the outside as an audio signal, after various processing is applied. The demodulation signal of the demodulation processing unit 5 is supplied to the digital filter 6, and the level detection for setting the gain of the AGC amplifier 4 is carried out.

In this embodiment, the digital filter 6 is assumed to be an IIR (Infinite Impulse Response) type LPF (Low Pass Filter), and is constructed so that the time constant is changeable. By smoothing the demodulation signal with this digital filter 6, a level corresponding to the receiving field strength can be obtained. Accordingly, by supplying the output signal of the digital filter 6 to the above-described AGC amplifier 4, the optimal gain of the AGC amplifier 4 can be set.

Figure 2:
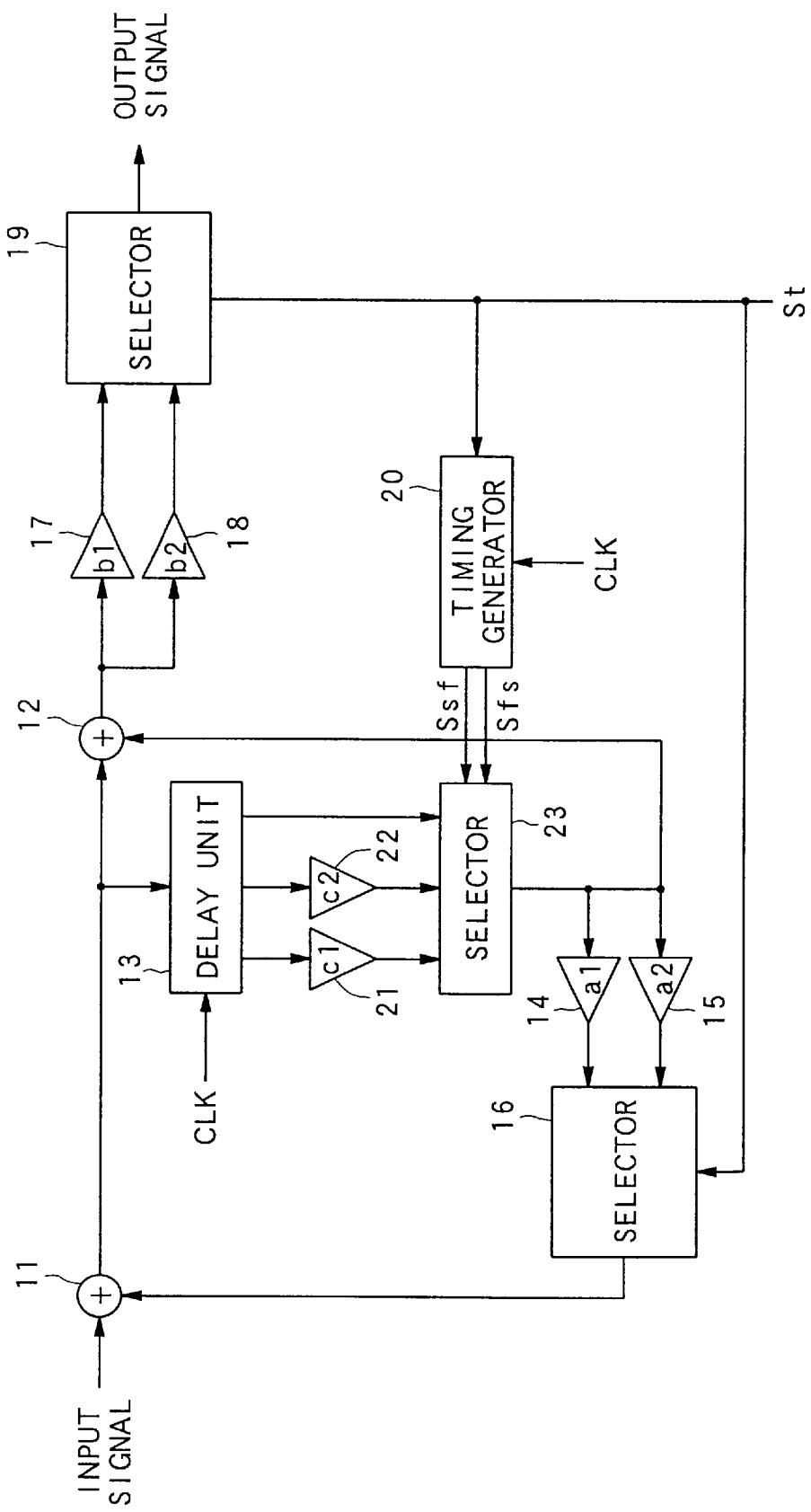
FIG. 2 is a block diagram showing the configuration of the digital filter of a preferred embodiment of the present invention.
Figure 3:
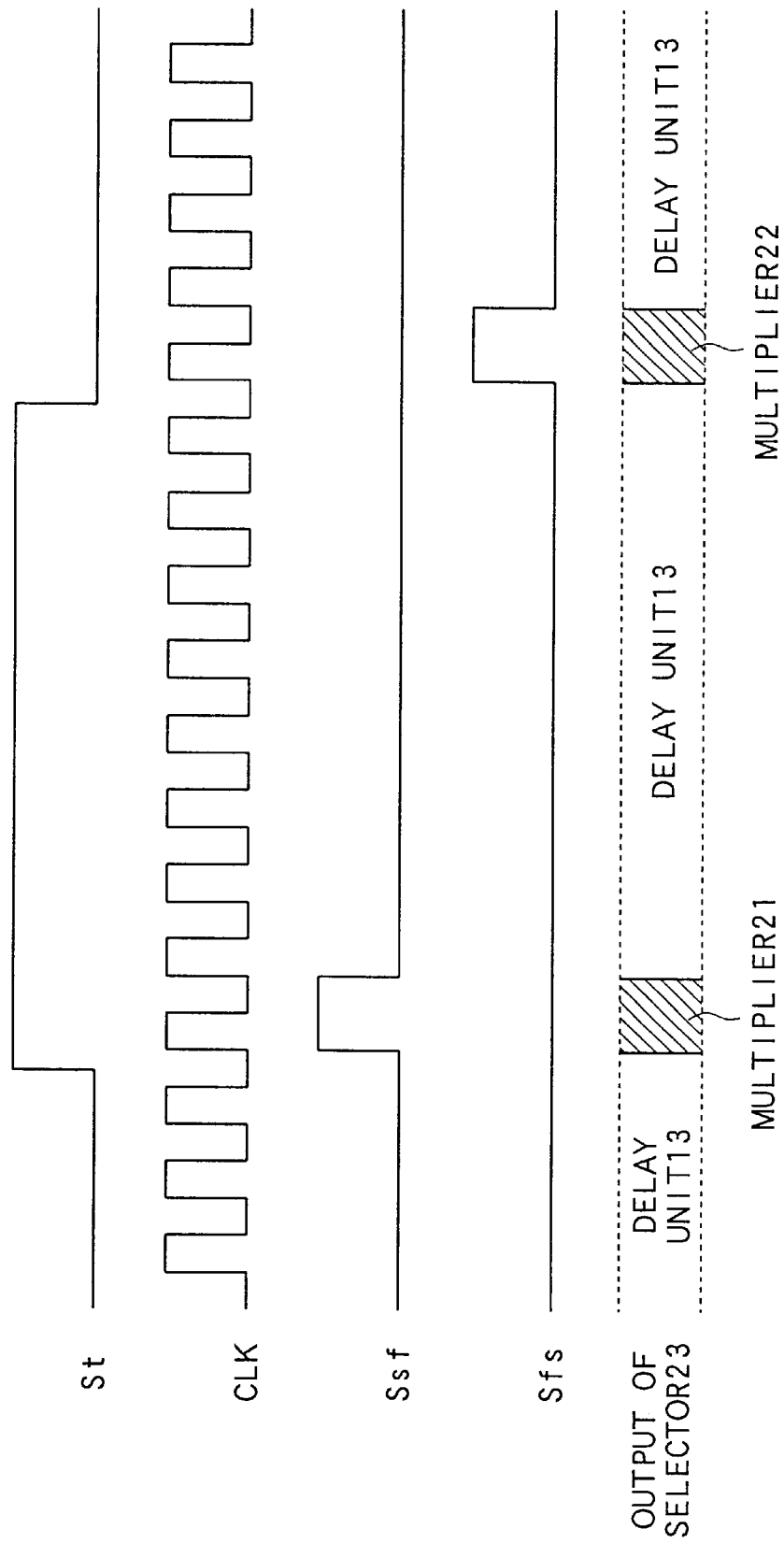
FIG. 3 is a diagram showing the signal waveform of each portion of the digital filter shown in FIG. 2.

The configuration of the operation of the digital filter 6 of this embodiment is described with reference to FIG. 2 and FIG. 3. FIG. 2 is a block diagram showing the configuration of the digital filter 6 of this embodiment. Further, FIG. 3 is a diagram showing the signal waveform of each portion of the digital filter 6 as shown in FIG. 2.

As shown in FIG. 2, the digital filter 6 related to this embodiment comprises adders 11 and 12, a delay unit 13, multipliers 14 and 15, a selector 16, multipliers 17 and 18, a selector 19, a timing generator 20, multipliers 21 and 22, and a selector 23. With such a configuration, a filter operation is applied to an input signal to attenuate the high-frequency components with a predetermined time constant, and a low-frequency component corresponding to the signal level can be extracted to obtain an output signal.

In the above configuration, the adder 11 adds the input signal and the output of the selector 16, and outputs a result of the addition. The output from the multiplier 14 and the output from the multiplier 15 are inputted to the selector 16 (functioning as the first selecting device of the present invention) which selectively switches the connection of one of the two inputted signals (14, 15) according to a time constant control signal St. A coefficient a1 is set in the multiplier 14, and a coefficient a2 is set in the multiplier 15. The preset coefficients a1 and a2 are respectively multiplied in the multipliers 14 and 15, and a result of the multiplication is outputted.

Then, the adder 12 adds the output from the adder 11 and the output of the selector 23, and outputs a result of the addition. The output of the adder 12 is inputted to the multipliers 17 and 18, and the respective outputs from the multipliers 17 and 18 are inputted to the selector 19. In the selector 19 functioning as the second selecting device of the present invention, one of the multipliers 17 and 18 is selectively switched for connection according to the time constant control signal St. A coefficient b1 is set in the multiplier 17, and a coefficient b2 is set in the multiplier 18. The preset coefficients b1 and b2 are respectively multiplied in the multipliers 17 and 18, and a result of the multiplication is outputted.

As shown in FIG. 3, the time constant control signal St is switched to a high level (H) or low level (L) at an appropriate timing. It is assumed that control is exercised so that the digital filter 6 is switched to a large time constant to slow down the response if the time constant control signal St is set to the low level, and that the digital filter 6 is switched to a small time constant to accelerate the response if the time constant control signal St is set to the high level. When the digital filter 6 is set to the large time constant, the output of the multiplier 14 is selected in the selector 16, and the output of the multiplier 17 is selected in the selector 19. Conversely, when the digital filter 6 is set to the small time constant, the output of the multiplier 15 is selected in the selector 16, and the output of the multiplier 18 is selected in the selector 19. Thus, the combination of the coefficients a1 and b1 corresponds to the large time constant, and the associated response speed of the digital filter 6 is low. Furthermore, the combination of the coefficients a2 and b2 corresponds to the small time constant with an associated fast response of the digital filter 6.

Since the digital filter 6 of this embodiment is applied to level detection in a tuner, it is effective to switch the time constant control signal St in response to any change in the receiving field strength. That is, it is only required that the digital filter 6 be set to the large time constant under normal conditions (the time constant control signal St is L), and the digital filter 6 be set to the small time constant for a predetermined time at the time when the receiving field strength rapidly changes (the time constant control signal St is H). Thus, under the circumstance where a tuner is being used in a car, the level detection is normally kept stable; however, if the receiving field strength rapidly increases at the instant when the car enters or exits a place where radio waves reach the tuner with difficulty, for instance, a tunnel, the process described above can appropriately be followed.

Then, the delay unit 13 delays the output from the adder 11 by one clock and outputs it. A clock CLK is supplied to the delay unit 13, and the clock CLK changes in a waveform pattern as shown in FIG. 3. The output from the delay unit 13 is supplied to the multiplier 21, the multiplier 22, and the selector 23, respectively. The outputs from the multipliers 21 and 22 and the direct output from the delay unit 13 are respectively inputted to the selector 23, and the outputs are selectively switched according to the two timing control signals Ssf and Sfs from the timing generator 20. A coefficient c1 is set in the multiplier 21, and a coefficient c2 is set in the 20 multiplier 22. In the respective multipliers 21 and 22, preset coefficients c1 and c2 are multiplied, and a result of the multiplication is outputted.

The timing generator 20 (functioning as the timing determination device of the present invention) is supplied with the time constant control signal St and the clock CLK, and, based on the configuration described in more detail below, generates the above described timing control signals Ssf and Sfs. The timing control signal Ssf is a signal showing the timing at which the time constant control signal St changes from low (L) to high (H). The timing control signal Sfs is a signal showing the timing at which the time constant control signal St changes from H to L. Thus, as shown in FIG. 3, the timing control signal Ssf switches from L to H in conjunction with the rise of the clock CLK just after the time constant control signal St changes from L to H, and generates a pulse for one clock. Furthermore, the timing control signal Sfs switches from L to H in conjunction with the rise of the clock CLK just after the time constant control signal St changes from H to L, and generates a pulse for one clock.

As shown in FIG. 3, in the selector 23, when both the timing control signal Ssf and the timing control signal Sfs are L, the output from the delay unit 13 is selected. On the other hand, when the timing control signal Ssf is H and the timing control signal Sfs is L, the output of the multiplier 21 is selected. Further, when the timing control signal Ssf is L and the timing control signal Sfs is H, the output of the multiplier 22 is selected. Thus, the selector 23 functions as the correction device of the present invention along with the multipliers 21 and 22.

Consequently, when the time constant of the digital filter 6 changes, the selector 23 functions to multiply the output of the delay unit 13 by the coefficient C1 or C2 for one clock after the switching. In all other conditions, the selector 23 functions to output the output of the delay 13 unit without any coefficient multiplication, which (as described in more detail below) can suppress noise caused momentarily by the digital operation just after switching the time constant of the digital filter 6.

Figure 4:
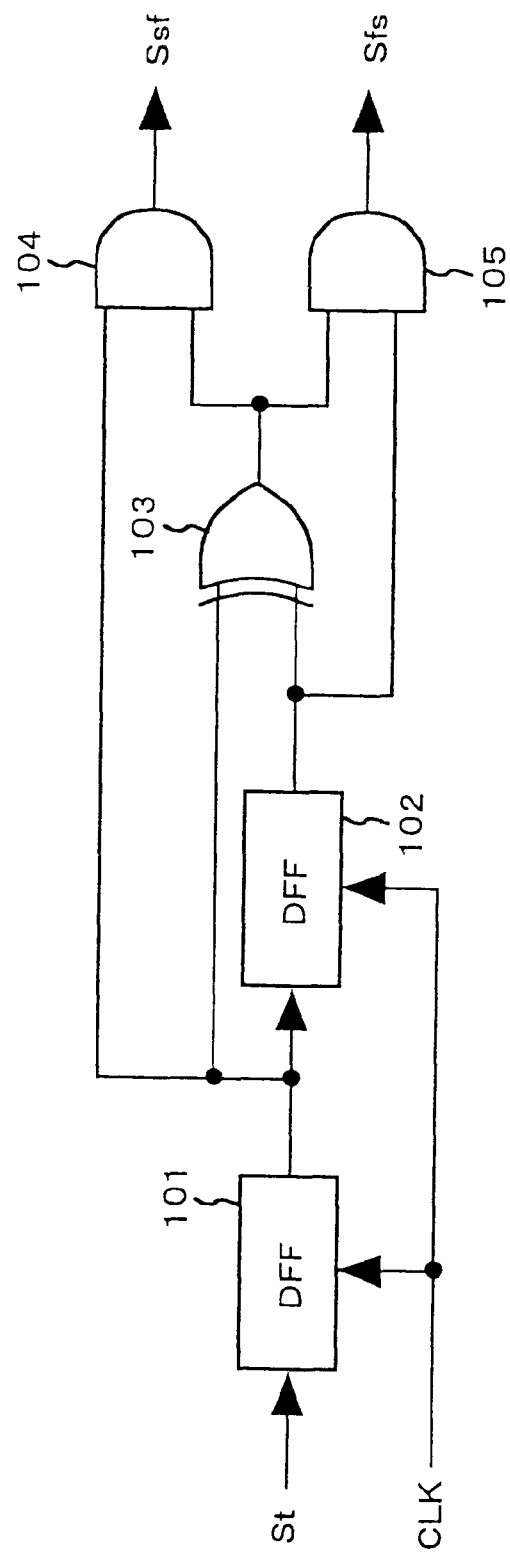
FIG. 4 is a block diagram showing a specific structural example of the timing generation.

FIG. 4 is a block diagram showing a schematic configuration of the timing generator 20. The timing generator 20 shown in FIG. 4 comprises D flip-flops 101 and 102, an EXOR circuit 103, and AND circuits 104 and 105. In the above configuration, the time constant control signal St inputted to the timing generator 20 is outputted in synchronization with the rise in the clock CLK by the front D flip-flop 101. Subsequently, the output of the front D flip-flop 101 is outputted in synchronization with the rise of the clock CLK by the rear D flip-flop 102.

Also, in the EXOR circuit 103, an exclusive logical sum of the output of the front D flip-flop 101 and the output of the rear D flip-flop 102 is obtained and outputted. As a result, the output of the EXOR circuit 103 takes a waveform pattern containing both pulses of the two timing control signals Ssf and Sfs shown in FIG. 3. Then, in one AND circuit 104, a logical id product of the output of the front D flip-flop 101 and the output of the EXOR circuit 103 is obtained and outputted. In the other AND circuit 105, a logical product of the output of the rear D flip-flop 102 and the output of the EXOR circuit 103 is obtained and outputted.

Accordingly, only the pulse of the timing control signal Ssf appears in the output of one AND circuit 104, and only the pulse of the timing control signal Sfs appears in the output of the other AND circuit 105, dependant on whether or not the input passed through the rear D flip-flop 102. Whereupon, the output of the AND circuit 104 is supplied to the selector 23 as the timing control signal Ssf, and the output of the AND circuit 105 is supplied to the selector 23 as the timing control signal Sfs.

Figure 5:
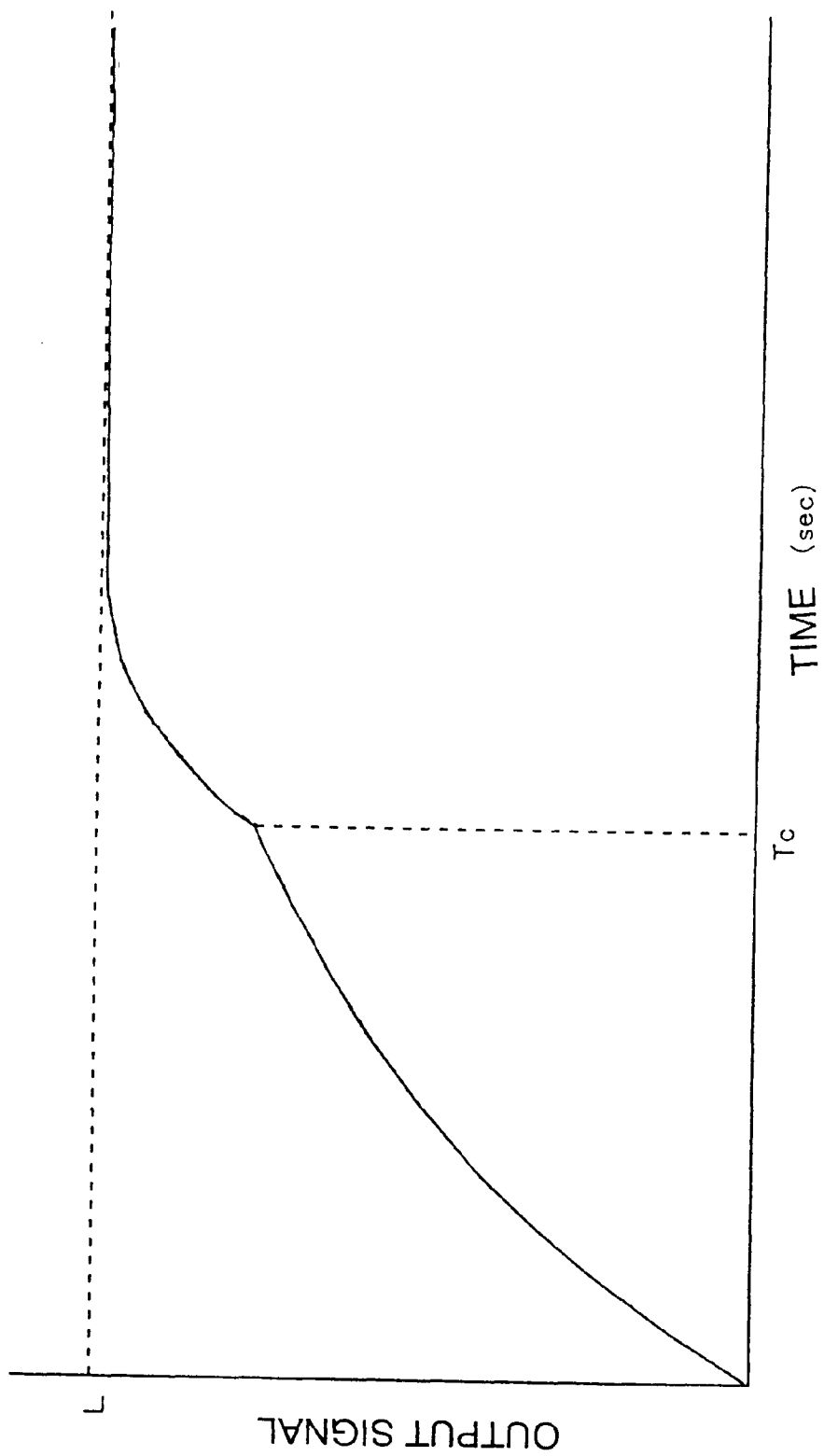
FIG. 5 is a graph for explaining an example of the change in the output signal when time constant control is performed in the digital filter.

FIG. 5 is a graph illustrating an example of the change in the output signal in the case where time constant control is exercised in the digital filter 6. The example of FIG. 5 shows the waveform pattern when the output signal of the digital filter 6 converges to the original level L, and control is exercised so that the time constant is set to the large time constant until the switching timing Tc whereupon it is switched to the small time constant at the switching timing Tc. In the example FIG. 5, it is assumed that control based on the timing control signal Ssf shown in FIG. 3 is performed at the switching timing Tc.

First, when the time constant is large before the switching timing Tc, change in the output signal with respect to time is gradual. When the time constant becomes small at the switching timing Tc, change in the output signal with respect to time becomes large. Thus, for a large time constant, it originally takes a long time for the output signal to converge to the level L, but the time is shortened by the switching control of the time constant. In addition to this, in this embodiment (as shown in FIG. 5), noise due to a digital operation does not appear in the output signal at the switching timing of the time constant.

Figure 6:
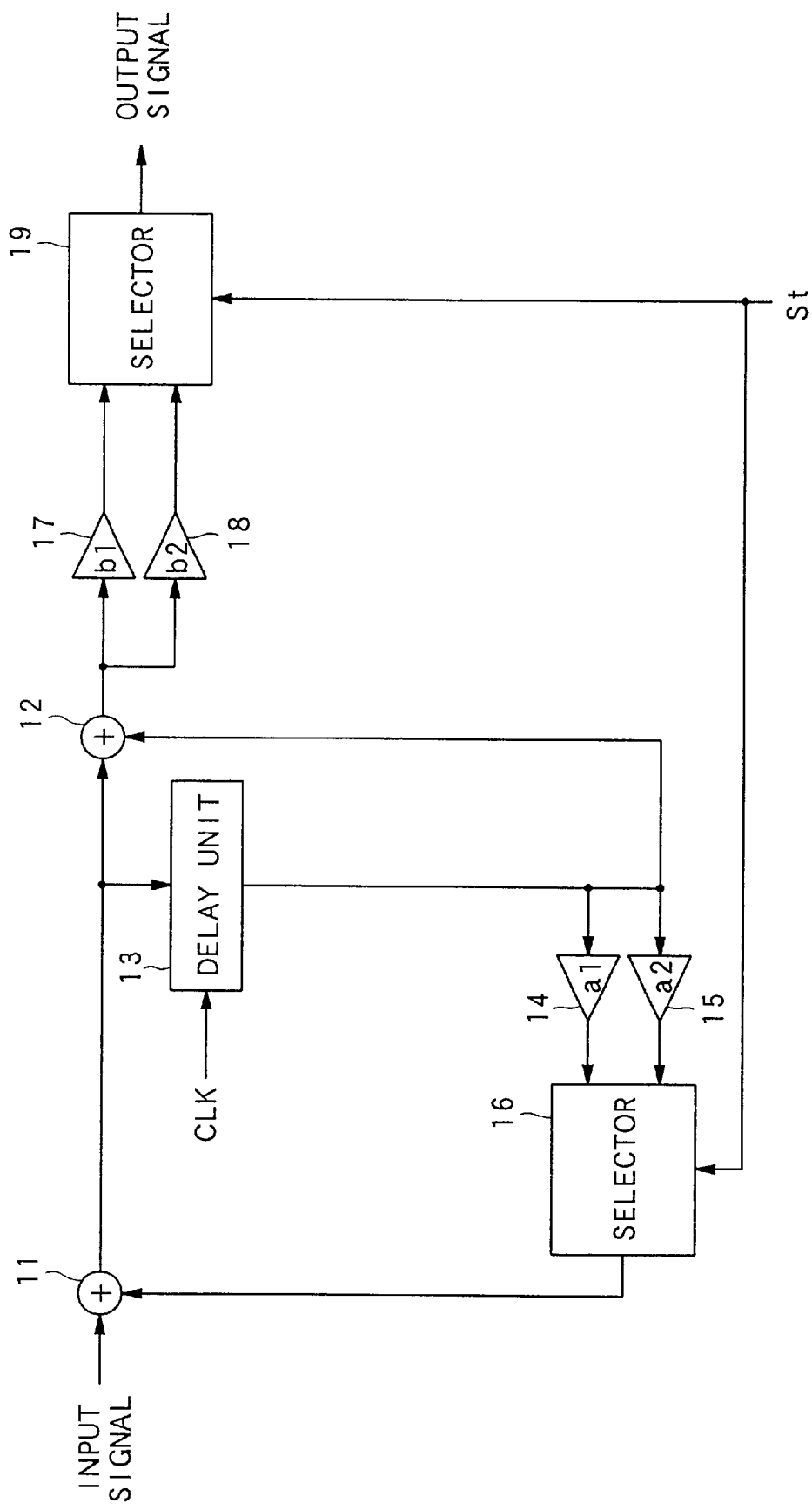
FIG. 6 is a diagram showing the configuration that applies when the multipliers 21 and 22 are not connected to the selector 19 in the configuration depicted in FIG. 2, but the output of the delay unit 13 is fixedly connected.
Figure 7:
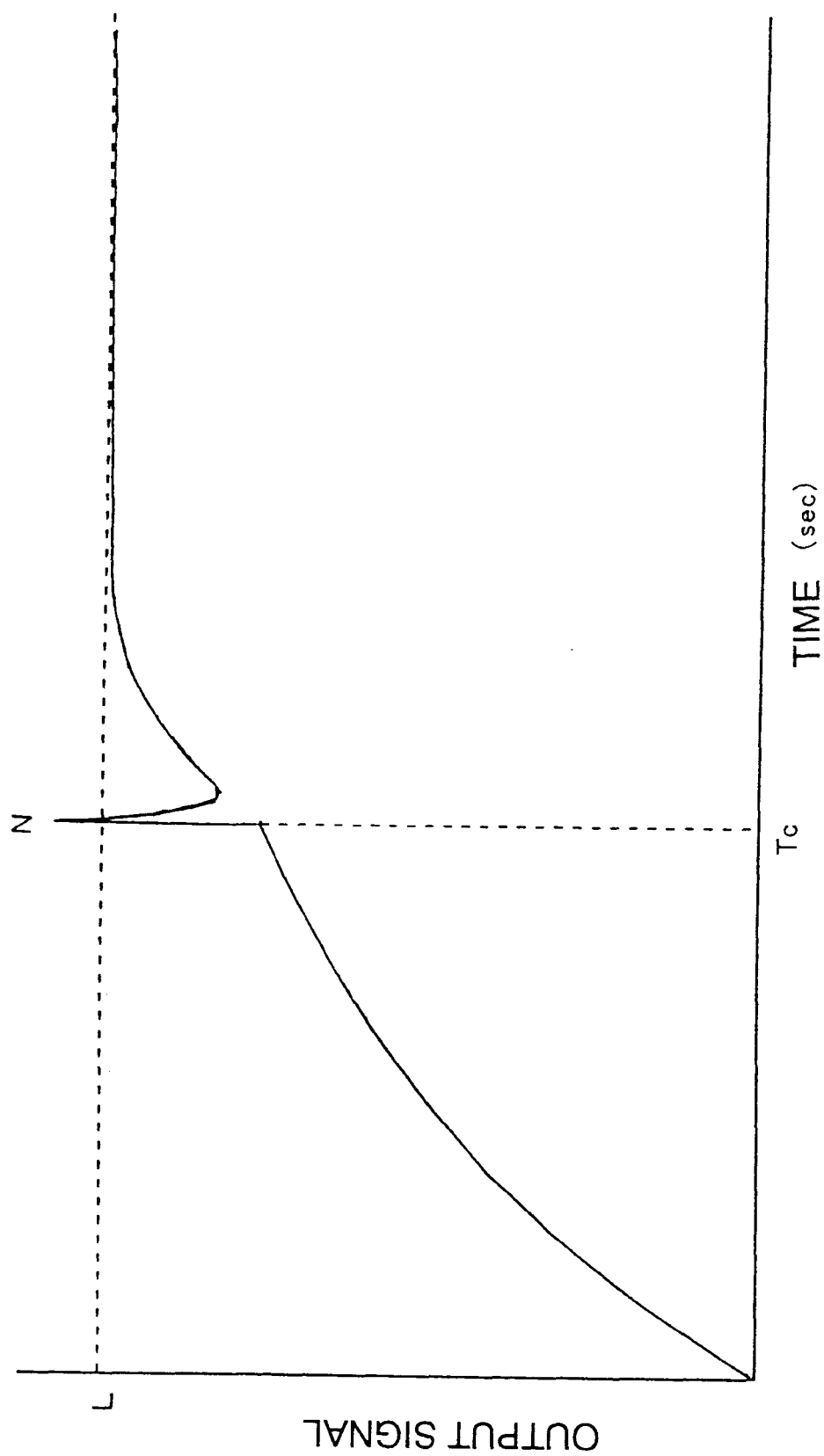
FIG. 7 is a graph showing a waveform pattern similar to FIG. 5, which corresponds to the configuration shown in FIG. 6.

An explanation is now provided as to the reason why no noise appears in the output signal at the time of switching the time constant if the switching control for the selector 23 is not performed for the configuration shown in FIG. 2. FIG. 6 is a diagram showing a configuration equivalent to the case where the output of the delay unit 13 is fixedly connected to the selector 23 without connecting the multipliers 21 and 22 to the selector 23 in the configuration shown in FIG. 2. Further, FIG. 7 is a graph showing a waveform pattern similar to FIG. 5, which corresponds to the configuration of FIG. 6. As shown in FIG. 7, it is found that a large spike-shaped noise N appears in the output signal at around the switching timing Tc.

In the configurations of FIG. 2 and FIG. 6, it is assumed that, as the coefficients corresponding to the large time constants, the values a1=0.99 and b1=0.005 are preset. Further, it is assumed that, as the coefficients corresponding to the small time constants, the values a2=0.9 and b2=0.05 are also preset. By way of example for the case in which "100" is inputted to the digital filter 6, the output of the digital filter 6 becomes "100" irrespective of whether the large or small time constants are set. The cut-off frequency of the digital filter 6 in this example becomes ten times greater when the small time constants are set, compared to when the large time constants are set. Thus, in the configurations show in FIG. 2 and FIG. 6, the level of the output signal is kept stable as the steady-state characteristic.

In contrast, the output of the delay unit 13 for the large time constants does not match that for the small time constants. Thus, in the above described numeric example, the output of the delay unit 13 becomes "10000" for the large time constants, and the output of the delay unit 13 becomes "1000" for the small time constants. However, in the transient characteristic of this case, the output of the delay unit 13 does not instantaneously change at the instant of time constant switching, rather, the output of the delay unit 13 gradually decreases from "10000" to "1000" for instance, at the switching from the large time constants to the small time constants.

Accordingly, at the moment of the switching timing Tc, the output of the delay unit 13 is "10000." In contrast, the coefficients a1 and b1 momentarily change to the coefficients a2 and b2, and thus (according to the configuration illustrated in FIG. 6), the output of the digital filter 6 becomes "1000", i.e., ten times large as the original output. Thereafter, the output of the digital filter 6 converges to "100" while the output of the delay unit 13 decreases to "1000." Thus, the output signal temporarily increases to cause the spike-shaped noise N until the output of the delay unit 13 stabilizes.

It may thus be seen in the configuration of this embodiment, the problem as described above is solved by performing the switching control for the selector 23. If the same condition as the above is assumed in the configuration shown in FIG. 2, it is only needed to set the coefficient c1 of the multiplier 21 to "0.1." Whereupon, at the switching timing Tc, the output of the delay unit 13 is corrected to 1/10 by the coefficient c1 for one clock, and the output of the digital filter 6 is kept at the original "100," so the above problem is solved. Furthermore, for the subsequent clocks, no correction is required since the output of the delay unit 13 becomes stable.

In the above example, the description has assumed the case where the large time constant changes to the small time constant. However, noise is also caused in the output signal in the converse situation where the small time constant changes to the large time constant. In such a case, contrary to the above description, during the process in which the output of the delay unit 13 is made to increase from "1000" to "10000" by the time constant switching, the output of the digital filter 6 converges to "100" after it becomes "10", i.e., 1/10 of the original one. In this case, noise having an opposite polarity to the noise N (depicted in FIG. 6) is produced. Accordingly, given the same condition as the above, it is only needed to set the coefficient c2 of the multiplier 22 to "10."

Although, in each embodiment described above, reference has been made to the case in which the digital filter related to the present invention is applied to a tuner for receiving AM, this is not a restriction, and the present invention can widely be applied to various apparatuses having a configuration in which a digital filter for applying a filter operation to an input signal is used, and the time constant is switched.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2001-171375 filed on Jun. 6, 2001 including the specification, claims, drawings and summary is incorporated herein by reference in its entirety.

What is claimed is:

1. A digital filter for forming a feedback path including a delay device, applying a filter operation to an input signal, giving a frequency characteristic having a predetermined time constant, and generating an output signal, comprising:

a time constant switching device having an operation device for implementing time constants in at least two stages, and selecting the connection of said operation device corresponding to a preset time constant to perform time constant switching;

a timing determination device for determining the timing when the time constant switching is performed by said time constant switching device; and a correction device for correcting the output of said delay device to suppress variations in the output signal in the determined timing.

2. The digital filter according to claim 1, wherein said time constant switching device has a first selecting device inserted inside said feedback path, and a second selecting device inserted outside said feedback path, said first selecting device and said second selecting device comprising:

two or more multipliers for which coefficients corresponding to different time constants are respectively set; and a selector for selectively connecting said multiplier matching said preset time constant.

3. The digital filter according to claim 1, wherein said input signal is the receiving signal of a tuner; and said output signal is used for detecting the level corresponding to said receiving signal.

4. The digital filter according to claim 3, wherein said time constants can be switched in two stages; and a large time constant is normally set as said time constant, while a small time constant is set as said time constant when the receiving field strength varies rapidly.

5. The digital filter according to claim 1, wherein said timing determination device determines the timing according to the switching direction of time constant by said time constant switching device.

6. The digital filter according to claim 5, wherein said timing determination device generates a timing control signal according to said switching direction of time constant in the determined timing.

7. The digital filter according to claim 6, wherein said correction device contains two or more multipliers in which coefficients corresponding to different time constants are respectively set; and a selector for selectively connecting the output of said multipliers or the output of said delay device based on said timing control signal in the determined timing.

8. The digital filter according to claim 6, wherein said timing control signal generates a pulse for one clock from the determined timing based on the clock supplied to said delay device.

9. The digital filter according to claim 8, wherein said correction device contains two or more multipliers in which coefficients corresponding to different time constants are respectively set; and a selector for selectively connecting the output of said multipliers or the output of said delay device based on said timing control signal in the determined timing.

10. A digital filter for forming a feedback path including a delay device, applying a filter operation to an input signal, giving a frequency characteristic having a predetermined time constant, and generating an output signal, comprising:

a time constant switching device for selecting one of time constants in at least two stages to perform time constant switching;

a timing determination device for determining the timing when time constant switching is performed by said time constant switching device; and a correction device for correcting the output of said delay device in the determined timing.

* * * * *